(12) United States Patent
Toyota et al.

(10) Patent No.: US 9,935,232 B2
(45) Date of Patent: Apr. 3, 2018

(54) METHOD OF MANUFACTURING SEMICONDUCTOR DEVICE

(71) Applicant: Toshiba Memory Corporation, Minato-ku, Tokyo (JP)

(72) Inventors: Gen Toyota, Oita Oita (JP); Shouta Inoue, Oita Oita (JP); Susumu Yamamoto, Oita Oita (JP); Takamasa Tanaka, Oita Oita (JP); Takamitsu Yoshida, Oita Oita (JP); Kazumasa Tanida, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/932,470

(22) Filed: Nov. 4, 2015

(65) Prior Publication Data

US 2016/0268469 A1 Sep. 15, 2016

(30) Foreign Application Priority Data

Mar. 12, 2015 (JP) ................................. 2015-049947

(51) Int. Cl.
| H01L 31/18 | (2006.01) |
| H01L 21/304 | (2006.01) |
| H01L 21/683 | (2006.01) |

(52) U.S. Cl.
CPC ............ *H01L 31/18* (2013.01); *H01L 21/304* (2013.01); *H01L 21/6835* (2013.01); *H01L 2221/6834* (2013.01); *H01L 2221/68327* (2013.01)

(58) Field of Classification Search
CPC ... H01L 31/18; H01L 21/304; H01L 21/6835; H01L 2221/68327; H01L 2221/6834; Y02P 70/521
See application file for complete search history.

(56) References Cited

U.S. PATENT DOCUMENTS

| 8,104,665 | B2 | 1/2012 | Sekiya |
| 8,248,502 | B2 * | 8/2012 | Aoki ................. H01L 27/14609 257/292 |
| 8,859,392 | B1 * | 10/2014 | Chang ................. H01L 21/187 438/197 |
| 9,282,268 | B2 * | 3/2016 | Tange ............... H01L 27/14627 |

(Continued)

FOREIGN PATENT DOCUMENTS

| JP | 07-335513 A | 12/1995 |
| JP | H11-297648 A | 10/1999 |

(Continued)

*Primary Examiner* — Fernando L Toledo
*Assistant Examiner* — Neil Prasad
(74) *Attorney, Agent, or Firm* — White & Case LLP

(57) ABSTRACT

According to one embodiment, a method of manufacturing a semiconductor device includes a step of grinding to thin a first semiconductor wafer on which a semiconductor device is formed in a state in which a surface of a second semiconductor wafer is fixed on a chuck table of a grinding device after bonding the first semiconductor wafer to the second semiconductor wafer. The method includes a step of fixing a surface of the first semiconductor wafer on the chuck table and grinding the surface of the second semiconductor wafer in a state in which the first semiconductor wafer is bonded to the second semiconductor wafer prior to the grinding step to thin the first semiconductor wafer.

17 Claims, 10 Drawing Sheets

(56) References Cited

U.S. PATENT DOCUMENTS

| | | | |
|---|---|---|---|
| 9,601,437 B2* | 3/2017 | Albermann | H01L 21/6836 |
| 2008/0132032 A1* | 6/2008 | Tomita | H01L 21/02024 |
| | | | 438/455 |
| 2008/0233840 A1* | 9/2008 | Pietsch | B24B 37/08 |
| | | | 451/41 |
| 2010/0099221 A1* | 4/2010 | Nakamura | H01L 21/6836 |
| | | | 438/109 |
| 2013/0115861 A1 | 5/2013 | Priewasser | |
| 2014/0084423 A1* | 3/2014 | Priewasser | H01L 21/78 |
| | | | 257/619 |

FOREIGN PATENT DOCUMENTS

| | | |
|---|---|---|
| JP | 2012-204545 A | 10/2012 |
| JP | 2013-102026 A | 5/2013 |
| JP | 5443151 B2 | 3/2014 |
| JP | 2014-226749 A | 12/2014 |
| JP | 2015-230971 A | 12/2015 |

* cited by examiner

METHOD OF MANUFACTURING SEMICONDUCTOR DEVICE

CROSS-REFERENCE TO RELATED APPLICATIONS

This application is based upon and claims the benefit of priority from Japanese Patent Application No. 2015-49947, filed on Mar. 12, 2015; the entire contents of which are incorporated herein by reference.

FIELD

Embodiments described herein relate generally to a method of manufacturing a semiconductor device.

BACKGROUND

Technology of manufacturing a semiconductor device by bonding a semiconductor wafer on which a semiconductor device is formed (hereinafter referred to as device wafer) to a semiconductor wafer which supports the device wafer (hereinafter referred to as support wafer) is conventionally disclosed. The device wafer is thinned in a state in which the device wafer is bonded to the support wafer, so that film thickness of the device wafer is adjusted to be desired film thickness.

A thinning step of the device wafer is performed while a surface of the support wafer is fixed on a chuck table of a grinding device, for example. Therefore, in the thinning of the device wafer, variation in film thickness of the support wafer directly affects the film thickness of the device wafer. The variation in film thickness of the device wafer affects a property of a semiconductor device formed on the device wafer. Therefore, a method of manufacturing a semiconductor device capable of thinning the device wafer while reducing the effect of the variation in film thickness of the support wafer is desired.

DETAILED DESCRIPTION

In general, according to one embodiment, a method of manufacturing a semiconductor device includes a step of grinding a first semiconductor wafer to thin in a state in which a surface of a second semiconductor wafer is fixed on a chuck table of a grinding device after bonding the first semiconductor wafer on which a semiconductor device is formed to the second semiconductor wafer. This includes a step of fixing a surface of the first semiconductor wafer on the chuck table and grinding the surface of the second semiconductor wafer in a state in which the first semiconductor wafer is bonded to the second semiconductor wafer prior to the step of thinning the first semiconductor wafer.

Exemplary embodiments of a method of manufacturing a semiconductor device will be explained below in detail with reference to the accompanying drawings. The present invention is not limited to the following embodiments.

First Embodiment

Figure 1A:
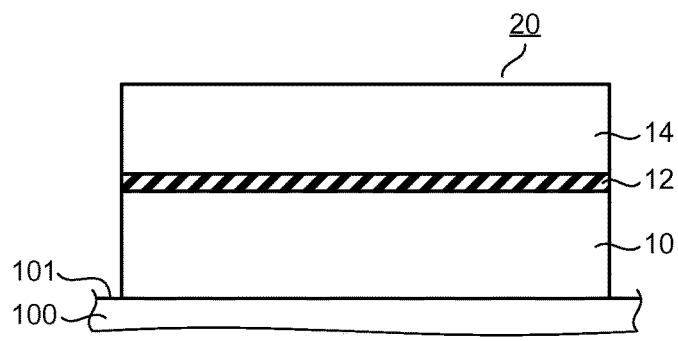
FIGS. 1A to 1D are views illustrating steps of a method of manufacturing a semiconductor device of a first embodiment.

FIGS. 1A to 1D are views illustrating a method of manufacturing a semiconductor device of a first embodiment. A semiconductor substrate 20 obtained by bonding a device wafer 10 to a support wafer 14 is prepared (FIG. 1A). Each of the device wafer 10 and the support wafer 14 is a single crystal silicon substrate, for example, and has film thickness of 775 μm, for example. There is an oxide silicon film 12 between the device wafer 10 and the support wafer 14. For example, the oxide silicon film 12 is the oxide silicon film formed on a surface of the support wafer 14. It is possible to bond the device wafer 10 to the support wafer 14 by superposing the both wafers (10 and 14) to be closely adhered to each other and performing a thermal process thereon after performing a process to allow a surface of the oxide silicon film 12 to adsorb a water molecule.

Figure 1B:
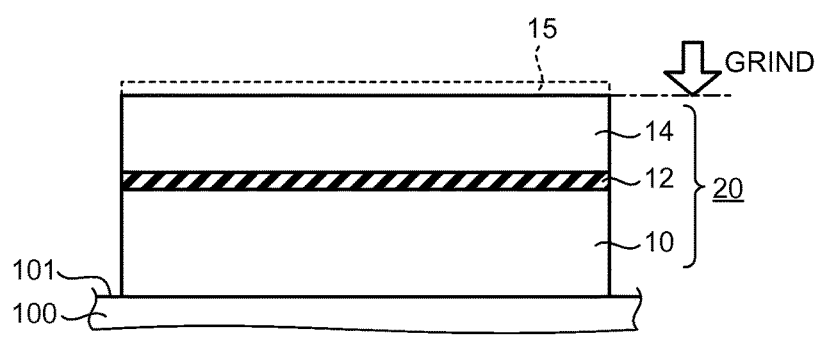

A surface of the device wafer 10 of the semiconductor substrate 20 is fixed on a mounting surface 101 of a chuck table 100 of a grinding device (not illustrated). The semiconductor substrate 20 is fixed on the chuck table 100 of the grinding device by an adsorbing mechanism provided on the chuck table 100, for example, vacuum adsorption. In a state in which the semiconductor substrate 20 is fixed on the chuck table 100, a grinder (not illustrated) provided with a grindstone (not illustrated) is allowed to abut the surface of the support wafer 14 and both the grinder and the chuck table 100 are rotated to grind a surface 15 of the support wafer 14. That is to say, in this embodiment, the surface of the support wafer 14 is ground prior to a thinning step of the device wafer 10. For example, the surface 15 of the support wafer 14 is ground by approximately 100 μm (FIG. 1B). Meanwhile, the method of grinding the semiconductor substrate 20 by rotating both the chuck table 100 and the grinder is referred to as infeed grinding.

Figure 1C:
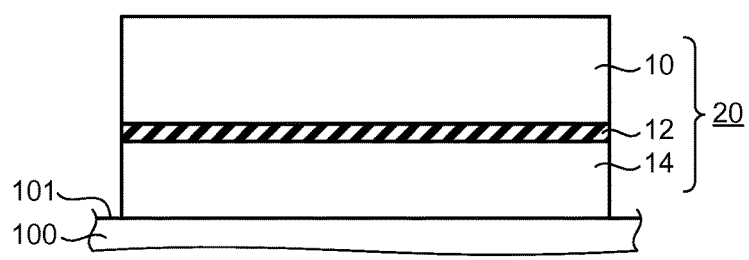

Next, the semiconductor substrate 20 is detached from the chuck table 100 and the semiconductor substrate 20 is fixed on the mounting surface 101 of the chuck table 100 such that a side of the support wafer 14 the surface area 15 of which is ground is put on the mounting surface 101 of the chuck table 100 of the grinding device, that is to say, such that the semiconductor substrate 20 is flipped upside down (FIG. 1C).

Figure 1D:
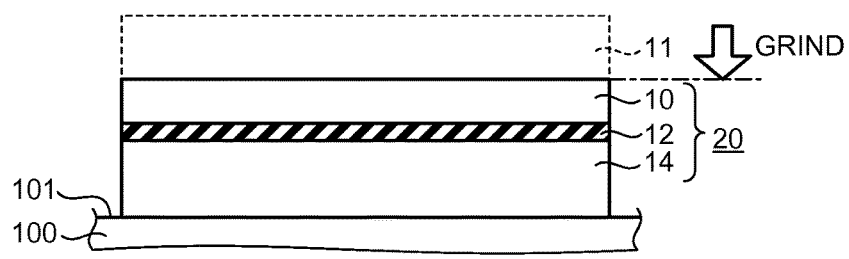

In a state in which the semiconductor substrate 20 is fixed on the chuck table 100, the grinder provided with the grindstone is allowed to abut the surface of the device wafer 10 of the semiconductor substrate 20 and both the grinder and the chuck table 100 are rotated to grind a surface area 11 of the device wafer 10 until the film thickness of 10 μm is obtained, for example (FIG. 1D). Thereafter, mirror finishing is performed on the surface of the device wafer 10 as needed and a semiconductor device (not illustrated) is formed on the device wafer 10. The mirror finishing is performed by CMP (chemical mechanical polishing), for example.

According to this embodiment, the surface of the support wafer 14 is ground prior to the thinning step of the device wafer 10. It is possible to evenly thin the device wafer 10 by performing the surface grinding of the support wafer 14 before the thinning step of the device wafer 10 to use the surface of the support wafer 14 having the ground surface as a reference surface for the thinning step of the device wafer 10. Meanwhile, it may also be configured that a silicon nitride film (not illustrated) is formed on the surface of the support wafer 14 in place of the oxide silicon film 12 and the support wafer 14 is adsorbed to the device wafer 10.

Figure 2A:
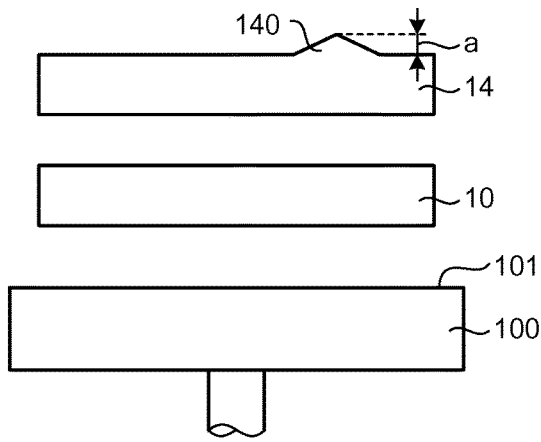
FIGS. 2A to 2D are views for illustrating an effect by the method of manufacturing the semiconductor device of the first embodiment.
Figure 2B:
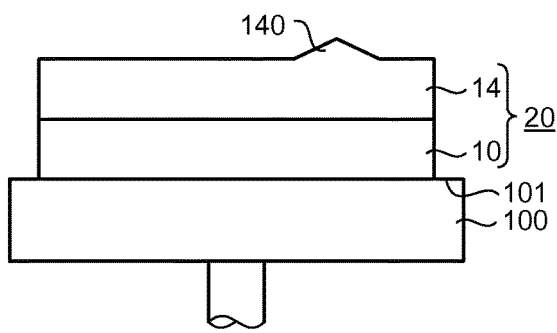

An effect of this embodiment is described with reference to FIGS. 2A to 2D. For example, a case in which there is a projection 140 having height of "a" on the surface of the support wafer 14 as illustrated in FIG. 2A is described. The semiconductor substrate 20 obtained by bonding the support wafer 14 to the device wafer 10 is fixed on the mounting surface 101 of the chuck table 100 of the grinding device (FIG. 2B). Although there is the oxide silicon film, for example, between the device wafer 10 and the support wafer 14, this is not illustrated.

Figure 2C:
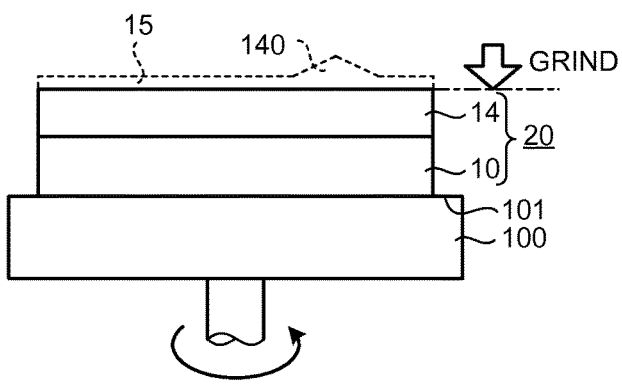

In a state in which the semiconductor substrate 20 is fixed on the mounting surface 101 of the chuck table 100, the chuck table 100 and the grinder (not illustrated) are rotated to grind the surface area 15 of the support wafer 14 (FIG. 2C). By the grinding of the surface of the support wafer 14, the projection 140 on the surface of the support wafer 14 is removed, for example, so that the surface of the support wafer 14 is planarized.

Next, the semiconductor substrate 20 is detached from the chuck table 100 and the side of the support wafer 14 having the ground surface is mounted on the mounting surface 101 of the chuck table 100 of the grinding device to be fixed. That is to say, the semiconductor substrate 20 is flipped upside down and the semiconductor substrate 20 is fixed on the mounting surface 101 of the chuck table 100 (FIG. 2D).

Figure 2D:
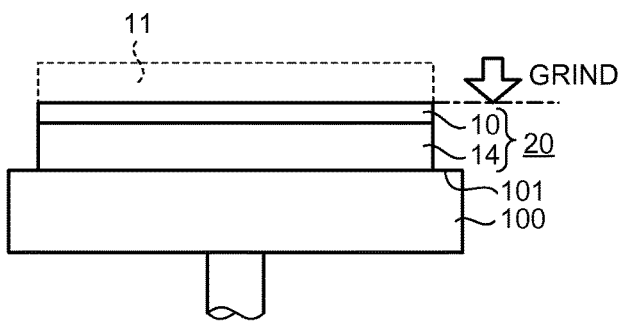

In a state in which the surface of the support wafer 14 of the semiconductor substrate 20 is fixed on the chuck table 100, the grinder provided with the grindstone is allowed to abut the surface of the device wafer 10 of the semiconductor substrate 20 and both the grinder and the chuck table 100 are rotated to grind the device wafer 10 until desired film thickness is obtained (FIG. 2D). That is to say, at the thinning step of the device wafer 10, the surface of the support wafer 14 fixed on the mounting surface 101 of the chuck table 100 is already planarized and variation in film thickness of the support wafer 14 is reduced. Therefore, even when there initially is the variation in film thickness of the support wafer 14, the variation in film thickness of the support wafer 14 is reduced in a stage of the thinning step of the device wafer 10, so that the device wafer 10 may be evenly thinned. It is possible to thin the device wafer 10 in a shorter time by using mechanical grinding with the grinder provided with the grindstone than by using CMP (chemical mechanical polishing) being a chemical polishing method, for example.

A case in which the support wafer 14 subjected to the surface grinding is used for thinning to finally obtain the thickness of 10 μm of the device wafer 10 by using the semiconductor substrate 20 obtained by bonding the device wafer 10 initially having the film thickness of 775 μm to the support wafer 14 also initially having the film thickness of 775 μm, and a case in which the device wafer 10 is thinned by using the support wafer 14 on which the surface grinding is not performed are compared. As a result, an average value of difference between maximum film thickness and minimum film thickness of the device wafer 10 is 0.7975 μm when the surface of the support wafer 14 is not ground, while the average value is 0.4525 μm when the device wafer 10 is thinned by using the support wafer 14 obtained after the planarization by grinding the surface. That is to say, when the device wafer 10 is thinned by using the support wafer 14 the surface of which is ground prior to the thinning step of the device wafer 10, a result that the variation in film thickness of the device wafer 10 is improved by approximately 50% as compared to a case in which the device wafer 10 is thinned by using the support wafer 14 the surface of which is not ground is obtained. Meanwhile, although the semiconductor substrate 20 of SOI (silicon on Insulator) in which there is the oxide silicon film 12 between the device wafer 10 and the surface of the support wafer 14 is described as an example, it is also possible to apply to a case of thinning the device wafer 10 by using the semiconductor substrate 20 obtained by directly bonding the device wafer 10 to the support wafer 14.

Figure 3:
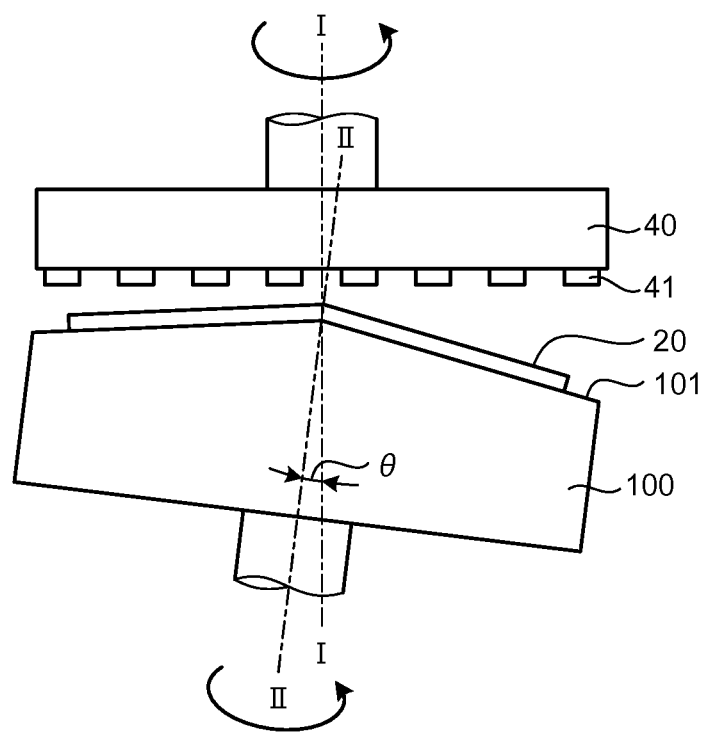
FIG. 3 is a view illustrating one example of a grinding device.

FIG. 3 is a view schematically illustrating one example of the grinding device of the semiconductor substrate 20. The grinding device illustrated in FIG. 3 includes the chuck table 100. The semiconductor substrate 20 is fixed on the mounting surface 101 of the chuck table 100. The semiconductor substrate 20 is fixed on the chuck table 100 of the grinding device by the adsorbing mechanism provided on the chuck table 100, for example, a vacuum adsorption mechanism (not illustrated).

The grinding device includes a grinder 40 provided with a grindstone 41 on a surface thereof. The grindstone 41 of the grinder 40 is allowed to abut the semiconductor substrate 20 and both the chuck table 100 and the grinder 40 are rotated to grind the surface of the semiconductor substrate 20. That is to say, this is an example of an infeed grinding device which rotates both the chuck table 100 and the grinder 40.

The chuck table 100 has a conical shape, for example. Since a surface shape of the chuck table 100 is the conical shape, the grinder 40 is brought into line contact with the semiconductor substrate 20 when the grinder 40 grinds the surface of the semiconductor substrate 20. Therefore, pressurizing force on the semiconductor substrate 20 by the grinder 40 becomes larger, so that a grinding speed may be increased. It is possible to adjust a contacting state between the semiconductor substrate 20 and the grinder 40 by adjusting an angle θ between a rotational axis I-I of the grinder 40 and a rotational axis II-II of the chuck table 100. For example, by adjusting inclination of the rotational axis of the grinder 40 according to a shape of the mounting surface 101 of the chuck table 100, therefore, a state of the surface of the semiconductor substrate 20, it is possible to evenly grind the semiconductor substrate 20. For example, when the shape of the mounting surface 101 of the chuck table 100 is a spherical shape, it is possible to adjust the contacting state between the grinder 40 and the semiconductor substrate 20 by adjusting the rotational axis of the grinder 40 according to the shape of the mounting surface 101.

Second Embodiment

Figure 4A:
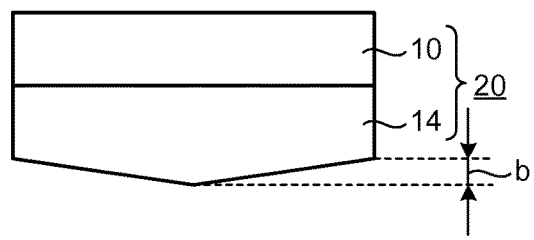
FIGS. 4A to 4C are views illustrating a part of steps of a method of manufacturing a semiconductor device of a second embodiment.
Figure 4B:
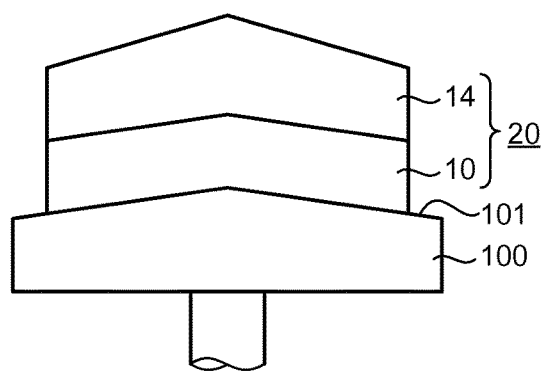
Figure 4C:
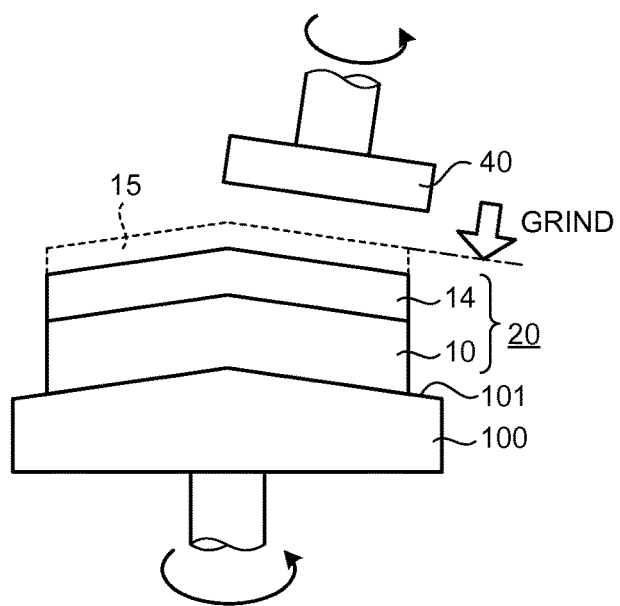

FIGS. 4A to 4C are views for schematically illustrating a method of manufacturing a semiconductor device of a second embodiment. The same reference numeral is assigned to a component corresponding to the already described embodiment. In this embodiment, a support wafer 14 a central portion of which is thicker than a peripheral portion by "b" is used. The support wafer 14 is bonded to a device wafer 10. Since the central portion of the support wafer 14 is thick, a central portion of a semiconductor substrate 20 obtained by bonding eventually becomes thick (FIG. 4A).

The device wafer 10 side of the semiconductor substrate 20 is fixed on a mounting surface 101 of a chuck table 100 (FIG. 4B). The semiconductor substrate 20 is fixed on the mounting surface 101 by an adsorbing mechanism (not illustrated) of the chuck table 100.

A surface of the support wafer 14 is ground in a state in which a surface of the device wafer 10 of the semiconductor substrate 20 is fixed on the mounting surface 101 of the chuck table 100. Infeed grinding in which both the chuck table 100 and the grinder 40 are rotated is performed (FIG. 4C). A surface area 15 of the support wafer 14 is ground such that film thickness of the support wafer 14 is made even in a state in which the support wafer 14 is bonded to the device wafer 10. For example, it is possible to make the film thickness of the support wafer 14 even by grinding the support wafer 14 while monitoring the film thickness by using laser light.

Figure 5A:
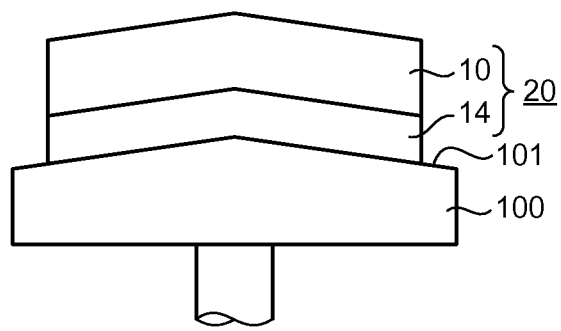
FIGS. 5A to 5C are views illustrating steps of the method of manufacturing the semiconductor device of the second embodiment continuous from FIG. 4C.

Next, the semiconductor substrate 20 is detached from the chuck table 100, the semiconductor substrate 20 is flipped upside down, and the support wafer 14 side is fixed on the chuck table 100 (FIG. 5A). That is to say, the surface of the support wafer 14 having the ground surface is fixed on the chuck table 100 and the surface of the support wafer 14 planarized by the grinding is made a reference surface at a thinning step of the device wafer 10.

Figure 5B:
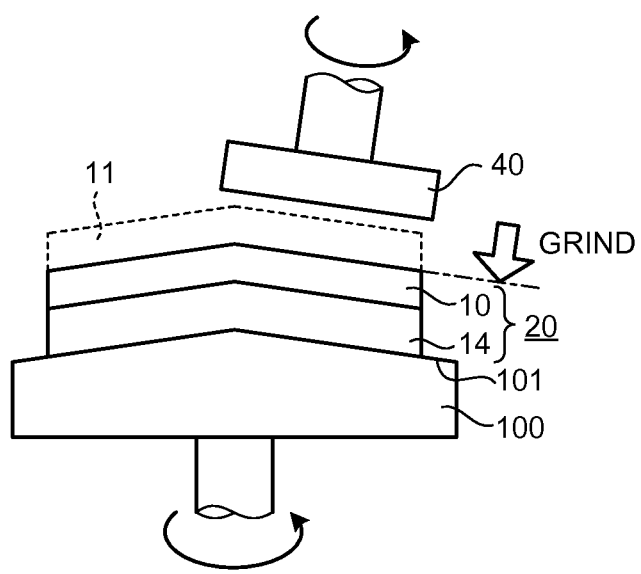

The grinding is performed for thinning the device wafer 10 in a state in which the surface of the support wafer 14 is fixed on the chuck table 100 (FIG. 5B). The grinding is performed by rotating both the chuck table 100 and the grinder 40. For example, when initial film thickness of the device wafer 10 is 775 µm, it is thinned until final film thickness of 10 µm of the device wafer 10 is obtained.

Figure 5C:
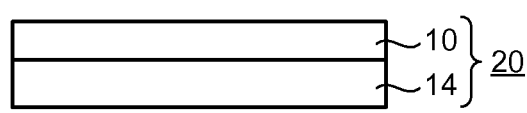

The semiconductor substrate 20 is detached from the chuck table 100 (FIG. 5C). A next step, for example, a process of forming a predetermined semiconductor device on the device wafer 10 is performed on the semiconductor substrate 20 detached from the grinding device.

In this embodiment, the surface of the support wafer 14 is ground prior to the thinning step of the device wafer 10. At a grinding step of the surface of the support wafer 14, it is possible to planarize the surface of the support wafer 14 to make the film thickness of the support wafer 14 even. It is possible to evenly thin the device wafer 10 by fixing the surface of the support wafer 14 the film thickness of which is made even on the mounting surface 101 of the chuck table 100 of the grinding device to make the same a reference surface at the grinding step for thinning the device wafer 10. That is to say, even when the central portion of the support wafer 14 is initially thick, it is possible to make the film thickness of the support wafer 14 even by grinding the surface of the support wafer 14 prior to the thinning step of the device wafer 10 to use as the support wafer 14 at the thinning step of the device wafer 10. It is possible to evenly thin the film thickness of the device wafer 10 by planarizing the surface of the support wafer 14 to make the film thickness even in advance.

Third Embodiment

Figure 6A:
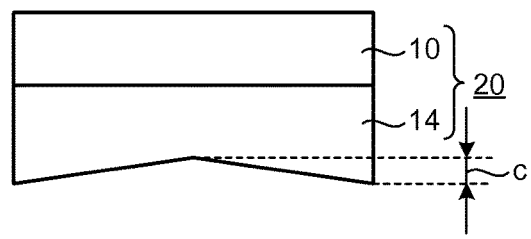
FIGS. 6A to 6C are views illustrating a part of steps of a method of manufacturing a semiconductor device of a third embodiment.
Figure 6B:
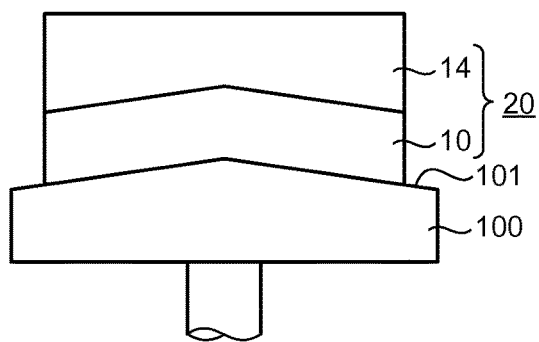
Figure 6C:
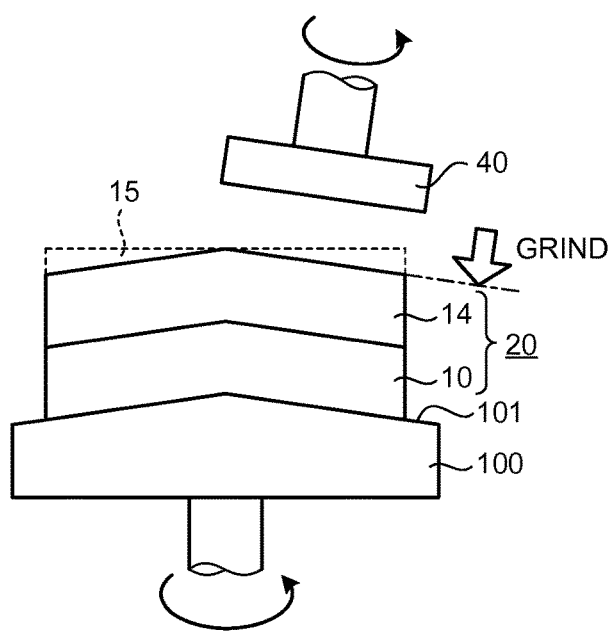

FIGS. 6A to 6C are views for schematically illustrating a method of manufacturing a semiconductor device of a third embodiment. The same reference numeral is assigned to a component corresponding to the already described embodiment. In this embodiment, a support wafer 14 a central portion of which is thinner than a peripheral portion by "c" is used. A semiconductor substrate 20 obtained by bonding the support wafer 14 to a device wafer 10 is prepared (FIG. 6A).

The device wafer 10 side of the semiconductor substrate 20 is fixed on a mounting surface 101 of a chuck table 100 (FIG. 6B). The semiconductor substrate 20 is fixed on the mounting surface 101 by an adsorbing mechanism (not illustrated) of the chuck table 100.

A surface side of the support wafer 14 is ground in a state in which the semiconductor substrate 20 is fixed on the mounting surface 101 of the chuck table 100. That is to say, infeed grinding in which both the chuck table 100 and the grinder 40 are rotated is performed (FIG. 6C). A surface area 15 of the support wafer 14 is ground such that film thickness of the support wafer 14 is made even in a state in which the support wafer 14 is bonded to the device wafer 10. For example, it is possible to make the film thickness of the support wafer 14 even by grinding while monitoring the film thickness by using laser light.

Figure 7A:
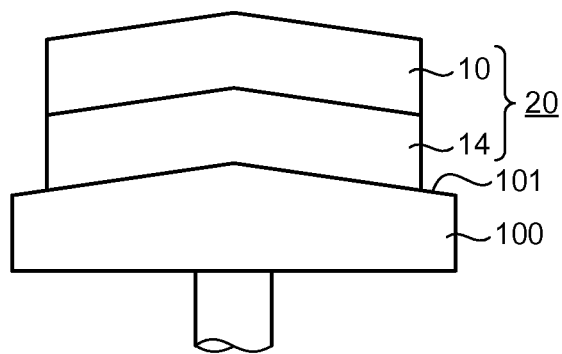
FIGS. 7A to 7C are views illustrating steps of the method of manufacturing the semiconductor device of the third embodiment continuous from FIG. 6C.

Next, the semiconductor substrate 20 is detached from the chuck table 100, the semiconductor substrate 20 is flipped upside down, and the surface of the support wafer 14 is fixed on the mounting surface 101 of the chuck table 100 (FIG. 7A). That is to say, the support wafer 14 the surface of which is ground to realize the even film thickness is fixed on the chuck table 100 and the surface of the support wafer 14 is made a reference surface at a thinning step of the device wafer 10.

Figure 7B:
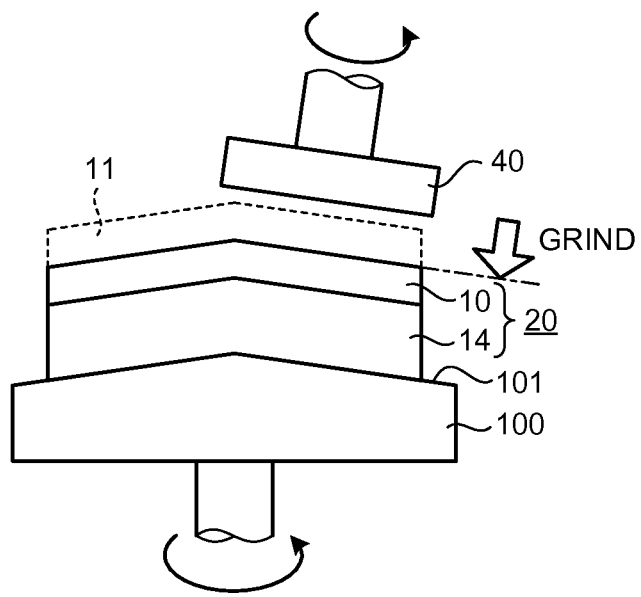

The grinding is performed for thinning the device wafer 10 in a state in which the surface of the support wafer 14 is fixed on the chuck table 100 (FIG. 7B). The grinding is performed by rotating both the chuck table 100 and the grinder 40. For example, when initial film thickness of the device wafer 10 is 775 µm, it is thinned until final film thickness of 10 µm of the device wafer 10 is obtained.

Figure 7C:
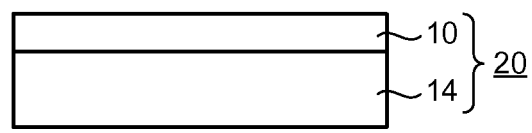

The semiconductor substrate 20 is detached from the chuck table 100 (FIG. 7C). A next step, for example, a process of forming a predetermined semiconductor device on the device wafer 10 is performed on the semiconductor substrate 20 detached from the grinding device.

In this embodiment, the surface of the support wafer 14 is ground prior to the thinning step of the device wafer 10. It is possible to make the film thickness of the support wafer 14 even by the grinding step of the surface of the support wafer 14. It is possible to evenly thin the device wafer 10 by fixing the surface of the support wafer 14 the film thickness of which is made even on the mounting surface 101 of the chuck table 100 of the grinding device to make the same a reference surface at the grinding step for thinning the device wafer 10. That is to say, even when the central portion of the support wafer 14 is initially thin, it is possible to planarize the surface of the support wafer 14 to make the film thickness of the support wafer 14 even by grinding the surface of the support wafer 14 prior to the thinning step of the device wafer 10. It is possible to evenly thin the device wafer 10 by fixing the surface of the support wafer 14 the surface of which is planarized having the even film thickness on the chuck table 100 to make the same the reference surface at the thinning step of the device wafer 10.

Fourth Embodiment

FIGS. 8A to 8D are views for illustrating a method of manufacturing a semiconductor device of a fourth embodiment. This embodiment illustrates one embodiment of a method of manufacturing a rear surface irradiation type CMOS image sensor.

Figure 8A:
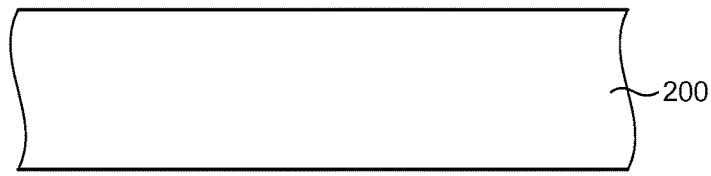
FIGS. 8A to 8D are views illustrating a part of steps of a method of manufacturing a semiconductor device of a fourth embodiment.

A semiconductor wafer 200 is prepared (FIG. 8A). The semiconductor wafer 200 is a silicon substrate, for example.

Figure 8B:
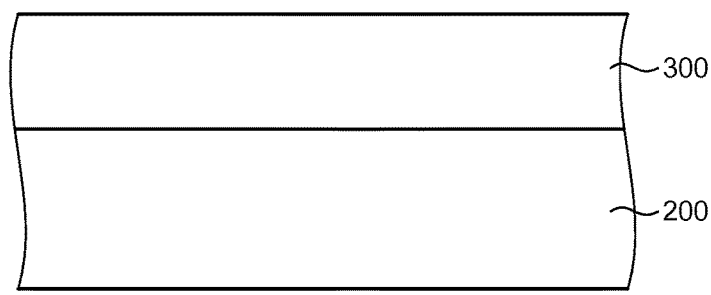

A semiconductor layer 300 is formed on the semiconductor wafer 200 by using an epitaxial method (FIG. 8B). The semiconductor layer 300 is an epitaxial silicon layer, for example. The semiconductor layer 300 is formed by CVD, for example.

Figure 8C:
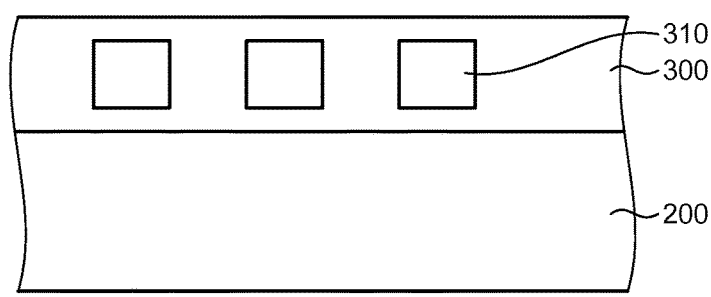

Steps referred to as FEOL (front end of line) such as a lithography step, a film depositing step, an etching step, and an ion implantation step are repeatedly performed on the semiconductor layer 300 to form a photoelectric conversion device 310, for example (FIG. 8C). The photoelectric conversion device 310 is a photo diode, for example.

Figure 8D:
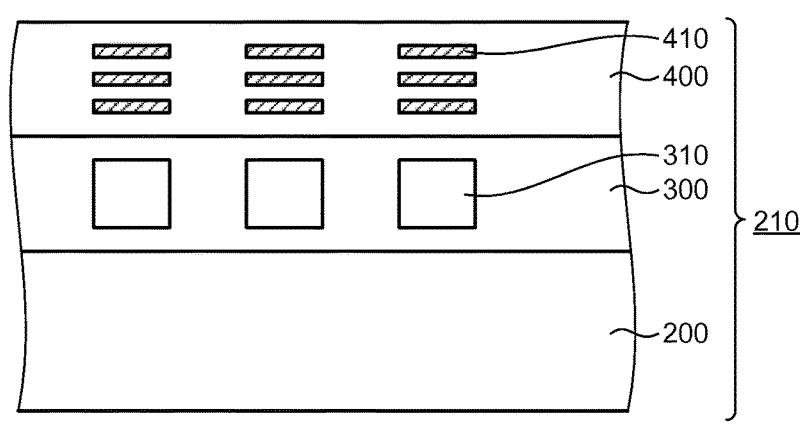

Next, an insulating film 400 including wiring 410 for electric connection formed therein is formed at a step referred to as BEOL (back end of line) (FIG. 8D). According to this, a device wafer 210 on which the photoelectric conversion device 310 is formed is formed. The wiring 410 formed in the insulating film 400 may be formed of Cu wiring having a damascene structure, for example. The insulating film 400 covering the wiring 410 is a silicon oxide film formed of TEOS (tetra ethyl ortho silicate), for example.

Figure 9A:
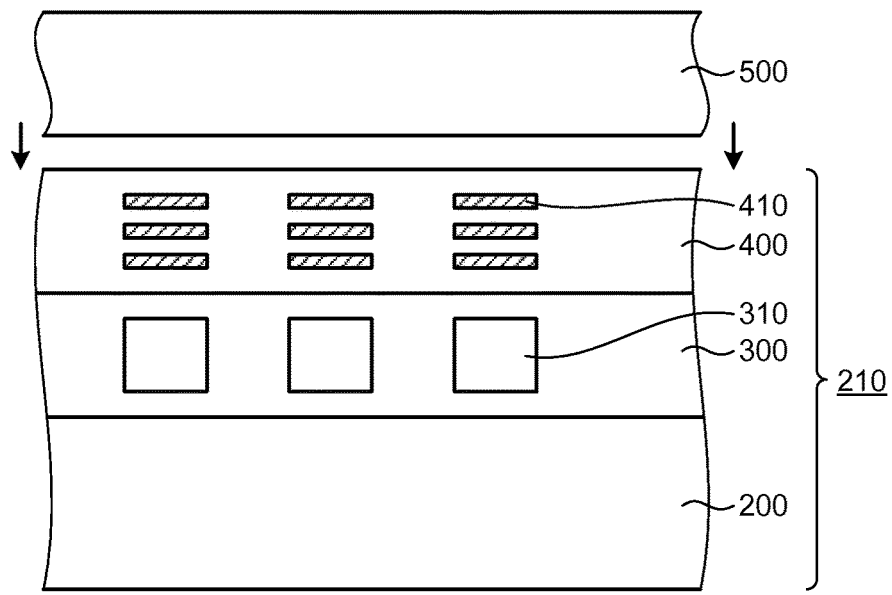
FIGS. 9A and 9B are views illustrating a part of steps of the method of manufacturing the semiconductor device of the fourth embodiment continuous from FIG. 8D.

Next, a support wafer 500 is formed on the insulating film 400 (FIG. 9A). The support wafer 500 is a silicon substrate, for example. The support wafer 500 is bonded to the insulating film 400, for example. In the bonding step, a step of cleaning a bonding surface, a step of activating a bonding surface and the like are performed. Thereafter, the support wafer 500 is aligned to the insulating film 400 and pressurized to be bonded thereto. Thereafter, an annealing process is performed to improve bonding strength.

Figure 9B:
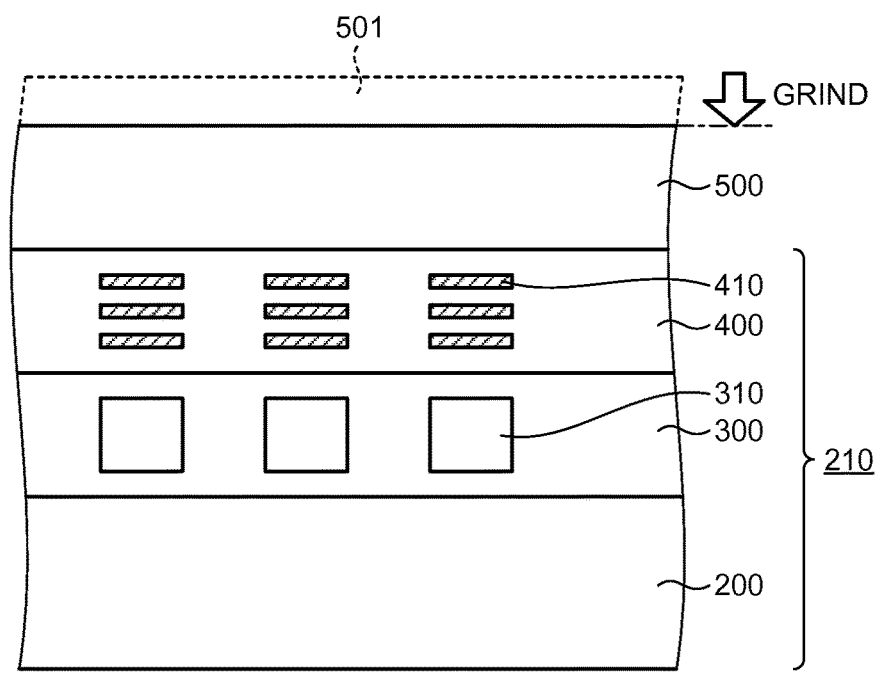

A surface 501 of the support wafer 500 is ground (FIG. 9B). It is possible to reduce variation in film thickness of the support wafer 500 and planarize the surface of the support wafer 500 as described above by grinding the surface of the support wafer 500.

Figure 10A:
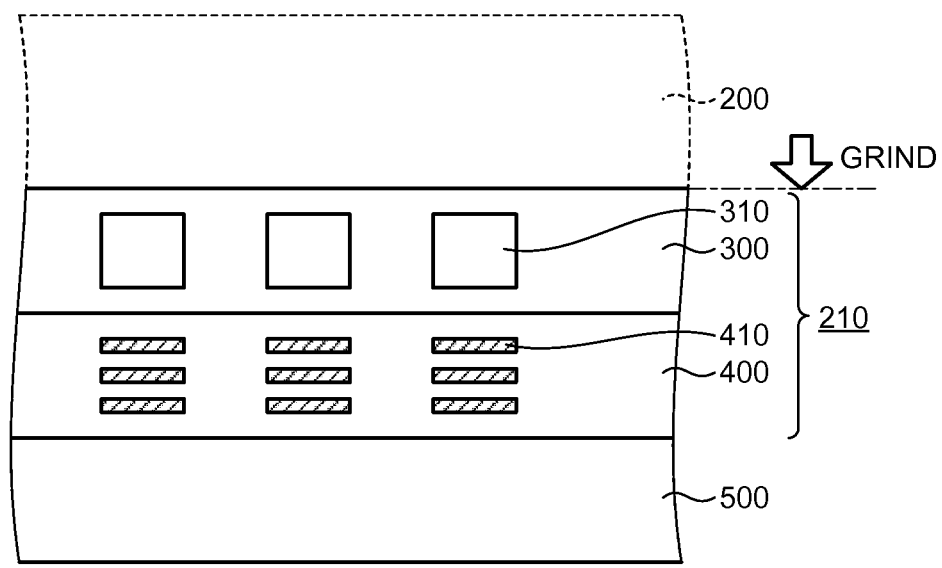
FIGS. 10A and 10B are views illustrating a part of steps of the method of manufacturing the semiconductor device of the fourth embodiment continuous from FIG. 9A.

Thereafter, a semiconductor substrate obtained by bonding the support wafer 500 to the semiconductor wafer 200 is flipped upside down, the surface of the support wafer 500 is fixed on a chuck table (not illustrated) of a grinding device (not illustrated), and the semiconductor wafer 200 is removed by infeed grinding (FIG. 10A).

Figure 10B:
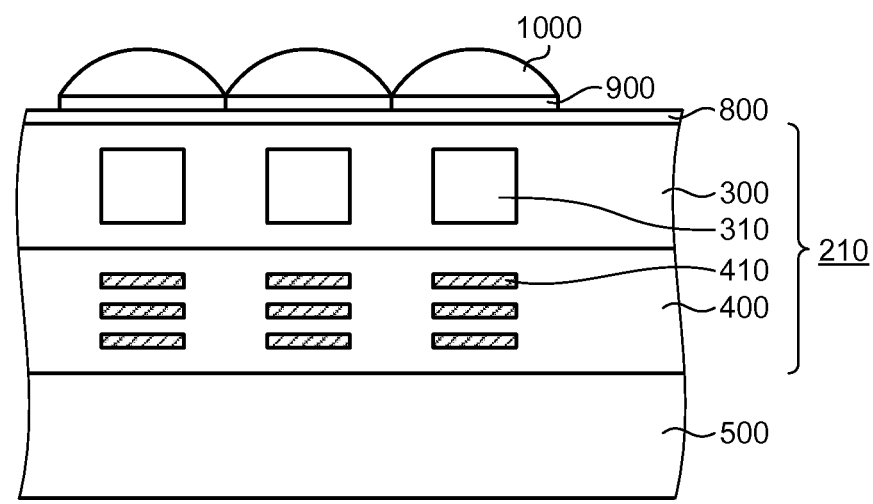

Subsequently, a protecting film 800 is formed on a surface of the semiconductor layer 300. The protecting film 800 may be formed of a silicon oxide film or a silicon nitride film, for example. The protecting film 800 is formed by CVD, for example. A color filter 900 and a micro lens 1000 are formed on the protecting film 800 so as to correspond to each photoelectric conversion device 310 (FIG. 10B). Although there is a separating layer between the photoelectric conversion devices 310 to separate each other, this is not illustrated.

According to the method of manufacturing the semiconductor device of this embodiment, a step of grinding to thin the semiconductor wafer 200 formed on the surface of the semiconductor layer 300 on which the photoelectric conversion device 310 being a semiconductor device is formed is performed by using the surface of the support wafer 500 the surface of which is ground prior to this step as a reference surface. By grinding the surface of the support wafer 500, it is possible to planarize the surface of the support wafer 500 and reduce variation in film thickness of the support wafer 500. Therefore, it is possible to evenly grind the semiconductor wafer 200 while fixing the support wafer 500 side on the chuck table. According to this, the variation in film thickness of the semiconductor layer 300 at the grinding step of the semiconductor wafer 200 may be reduced, so that an effect on a property of the photoelectric conversion device 310 formed on the semiconductor layer 300 is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:

preparing a first semiconductor wafer which includes a semiconductor substrate and a semiconductor layer formed on the semiconductor substrate;

forming a predetermined semiconductor device on the semiconductor layer formed on the semiconductor substrate;

forming an insulating film including a wiring on the semiconductor layer after forming the predetermined semiconductor device on the semiconductor layer;

bonding the first semiconductor wafer to a second semiconductor wafer in such a manner that the semiconductor layer of the first semiconductor wafer and the insulating film are provided between the semiconductor substrate of the first semiconductor wafer and the second semiconductor wafer;

fixing a surface of the semiconductor substrate of the first semiconductor wafer on a chuck table of a grinding device in a state in which the first semiconductor wafer and the second semiconductor wafer are bonded;

grinding a surface of the second semiconductor wafer to thin the second semiconductor wafer in a state in which the surface of the semiconductor substrate of the first semiconductor wafer is fixed on the chuck table of the grinding device in the state in which the first semiconductor wafer and the second semiconductor wafer are bonded;

fixing a surface of the second semiconductor wafer on the chuck table after the grinding of the surface of the second semiconductor wafer in the state in which the first semiconductor wafer and the second semiconductor wafer are bonded;

grinding the surface of the semiconductor substrate of the first semiconductor wafer to thin the first semiconductor wafer and to form a ground surface on the semiconductor substrate of the first semiconductor wafer in a state in which the surface of the second semiconductor wafer is fixed on the chuck table in the state in which the first semiconductor wafer and the second semiconductor wafer are bonded; and forming a protecting film on the ground surface of the first semiconductor wafer after the grinding of the surface of the semiconductor substrate of the first semiconductor wafer.

2. The method of manufacturing the semiconductor device according to claim 1, wherein
the chuck table includes a conical mounting surface, and
the fixing the surface of the semiconductor substrate of the first semiconductor wafer on the chuck table includes fixing the surface of the semiconductor substrate of the first semiconductor wafer on the conical mounting surface.

3. The method of manufacturing the semiconductor device according to claim 1, wherein
the grinding device is provided with a grinder, and
the grinding the surface of the second semiconductor wafer includes grinding the surface of the second semiconductor wafer while rotating both the chuck table and the grinder.

4. The method of manufacturing the semiconductor device according to claim 3, comprising:
grinding the surface of the second semiconductor wafer while adjusting a rotational axis of the grinder according to a shape of the mounting surface of the chuck table.

5. A method of manufacturing a semiconductor device comprising:
bonding a first semiconductor wafer to a second semiconductor wafer, wherein the first semiconductor wafer includes a semiconductor substrate, a semiconductor layer formed on the semiconductor substrate, and an insulating film including a wiring formed on the semiconductor layer, and wherein the semiconductor layer and the insulating film of the first semiconductor wafer are provided between the semiconductor substrate of the first semiconductor wafer and the second semiconductor wafer;
fixing a surface of the first semiconductor wafer on a mounting surface of a grinding device in a state in which the first semiconductor wafer and the second semiconductor wafer are bonded;
grinding a surface of the second semiconductor wafer to form a first ground surface in a state in which the surface of the first semiconductor wafer is fixed on a chuck table of the grinding device in the state in which the first semiconductor wafer and the second semiconductor wafer are bonded;
fixing the first ground surface of the second semiconductor wafer on the chuck table of the grinding device after grinding the surface of the second semiconductor wafer in the state in which the first semiconductor wafer and the second semiconductor wafer are bonded;
grinding the surface of the first semiconductor wafer to thin the first semiconductor wafer and to form a second ground surface in a state in which the first ground surface of the second semiconductor wafer is fixed on the mounting surface of the grinding device in the state in which the first semiconductor wafer and the second semiconductor wafer are bonded; and forming a protecting film on the second ground surface of the first semiconductor wafer after the grinding of the surface of the first semiconductor wafer.

6. The method of manufacturing the semiconductor device according to claim 5, further comprising:
forming a predetermined semiconductor device on the first semiconductor wafer before bonding the first semiconductor wafer to the second semiconductor wafer.

7. The method of manufacturing the semiconductor device according to claim 5, wherein
the chuck table includes a conical mounting surface, and
the method further comprising grinding the surface of the second semiconductor wafer while fixing the surface of the first semiconductor wafer on the conical mounting surface of the chuck table.

8. The method of manufacturing the semiconductor device according to claim 5, wherein
the grinding device is provided with a grinder, and
the method further comprising grinding the surface of the second semiconductor wafer while rotating both the chuck table and the grinder.

9. The method of manufacturing the semiconductor device according to claim 8, further comprising:
grinding the surface of the second semiconductor wafer while adjusting a rotational axis of the grinder according to a shape of the mounting surface of the chuck table.

10. A method of manufacturing a semiconductor device, the method comprising:
forming a semiconductor device on a first surface of a first semiconductor wafer including the first surface and a second surface;
forming an insulating film including a wiring on the first surface of the first semiconductor wafer after forming the semiconductor device:
bonding a second semiconductor wafer on the first surface of the first semiconductor wafer after forming the insulating film in such a manner that the insulating film is provided between the first semiconductor wafer and the second semiconductor wafer;
fixing the second surface of the first semiconductor wafer on a chuck table of a grinding device in a state in which the first semiconductor wafer is bonded to the second semiconductor wafer;
grinding a surface of the second semiconductor wafer to form a first ground surface in a state in which the second surface of the first semiconductor wafer is fixed on the chuck table of the grinding device in the state in which the first semiconductor wafer and the second semiconductor wafer are bonded;
fixing the first ground surface of the second semiconductor wafer on the chuck table of the grinding device in the state in which the first semiconductor wafer and the second semiconductor wafer are bonded;
grinding the second surface of the first semiconductor wafer to form a second ground surface in a state in which the first ground surface of the second semiconductor is fixed on the chuck table of the grinding device in the state in which the first semiconductor wafer and the second semiconductor wafer are bonded; and
forming a protecting film on the second ground surface of the first semiconductor wafer after the grinding of the second surface of the first semiconductor wafer.

11. The method of manufacturing the semiconductor device according to claim 10, wherein
the forming the semiconductor device comprises:

forming the first semiconductor wafer by forming a semiconductor layer on a surface of a semiconductor substrate; and forming the semiconductor device on the semiconductor layer.

12. The method of manufacturing the semiconductor device according to claim 11, further comprising:

grinding the first semiconductor wafer until the semiconductor substrate of the first semiconductor wafer is removed.

13. The method of manufacturing the semiconductor device according to claim 10, wherein the chuck table includes a conical mounting surface, and the fixing the first ground surface of the second semiconductor wafer on the chuck table includes fixing the first ground surface of the second semiconductor wafer on the conical mounting surface of the chuck table.

14. The method of manufacturing the semiconductor device according to claim 10, wherein forming the semiconductor device includes forming a photoelectric conversion device.

15. The method of manufacturing the semiconductor device according to claim 10, wherein the grinding device is provided with a grinder, and the method further comprising grinding the surface of the second semiconductor wafer while rotating both the chuck table and the grinder.

16. The method of manufacturing the semiconductor device according to claim 15, further comprising:

grinding the surface of the second semiconductor wafer while adjusting a rotational axis of the grinder according to a shape of the mounting surface of the chuck table.

17. The method of manufacturing the semiconductor device according to claim 14, further comprising:

forming a micro lens on the protecting film so as to correspond to the photoelectric conversion device.

* * * * *